(12) United States Patent  
Samardzija et al.

(10) Patent No.: US 12,416,901 B2  
(45) Date of Patent: *Sep. 16, 2025

(54) ELECTRONIC DEVICE WITH NEAR-FIELD ANTENNA OPERATING THROUGH DISPLAY

(71) Applicant: Apple Inc., Cupertino, CA (US)

(72) Inventors: Miroslav Samardzija, Mountain View, CA (US); Yiren Wang, Cupertino, CA (US); Yuehui Ouyang, Sunnyvale, CA (US); Joseph Hakim, Jacksonville, OR (US); Qingxiang Li, Cupertino, CA (US); Robert W. Schlub, Palo Alto, CA (US); Ruben Caballero, San Jose, CA (US); Siwen Yong, San Francisco, CA (US); Erik G. de Jong, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/525,528

(22) Filed: Nov. 30, 2023

(65) Prior Publication Data

US 2024/0097309 A1 Mar. 21, 2024

Related U.S. Application Data

(60) Continuation of application No. 17/527,906, filed on Nov. 16, 2021, now Pat. No. 11,894,600, which is a
(Continued)

(51) Int. Cl.
*G04R 60/10* (2013.01)
*G04G 21/04* (2013.01)
(Continued)

(52) U.S. Cl.
CPC ............ *G04R 60/10* (2013.01); *G04G 21/04* (2013.01); *G06F 1/163* (2013.01); *H01Q 1/22* (2013.01);
(Continued)

(58) Field of Classification Search
CPC ............ H01Q 1/243; H01Q 7/00; H01Q 1/44; H01Q 1/38; H01Q 9/42; H01Q 1/2225;
(Continued)

(56) References Cited

U.S. PATENT DOCUMENTS 6,825,751 B1 11/2004 Kita et al.
9,626,024 B1 * 4/2017 Tan ........................ H05K 13/00
(Continued)

FOREIGN PATENT DOCUMENTS

EP 2474872 B1 7/2012
EP 2337150 A1 12/2012
(Continued)

*Primary Examiner* — Golam Sorowar
(74) *Attorney, Agent, or Firm* — Treyz Law Group, P.C.; Tianyi He

(57) ABSTRACT

An electronic device may have a display. A display cover layer and a transparent inner display member may overlap a display pixel layer. The display pixel layer may have an array of display pixels for displaying images for a user. A touch sensor layer may be interposed between the display pixel layer and the transparent display member. A ferromagnetic shielding layer may be mounted below the display pixel layer. A flexible printed circuit containing coils of metal signal lines that form a near-field communications loop antenna may be interposed between the ferromagnetic shielding layer and the display pixel layer. A non-near-field antenna such as an inverted-F antenna may have a resonating element mounted on an inner surface of the display cover layer. The resonating element may be interposed between the transparent display member and the display cover layer.

20 Claims, 17 Drawing Sheets

Related U.S. Application Data continuation of application No. 16/596,593, filed on Oct. 8, 2019, now Pat. No. 11,205,832, which is a division of application No. 15/625,903, filed on Jun. 16, 2017, now Pat. No. 10,461,395, which is a continuation of application No. 15/090,781, filed on Apr. 5, 2016, now Pat. No. 9,685,690, which is a continuation of application No. 14/259,861, filed on Apr. 23, 2014, now Pat. No. 9,356,661.

(51) Int. Cl.
| | | |
|---|---|---|
| *G06F 1/16* | (2006.01) | |
| *H01Q 1/22* | (2006.01) | |
| *H01Q 1/27* | (2006.01) | |
| *H01Q 1/52* | (2006.01) | |
| *H01Q 7/00* | (2006.01) | |
| *H01Q 9/04* | (2006.01) | |
| *H01Q 9/42* | (2006.01) | |
| *H01Q 21/28* | (2006.01) | |
| *H04B 5/26* | (2024.01) | |
| *H04B 5/48* | (2024.01) | |
| *H04B 5/70* | (2024.01) | |
| *H04B 5/72* | (2024.01) | |
| *H05K 1/02* | (2006.01) | |
| *H05K 5/03* | (2006.01) | |
| *H10K 59/40* | (2023.01) | |

(52) U.S. Cl.
CPC ............... *H01Q 1/273* (2013.01); *H01Q 1/52* (2013.01); *H01Q 1/526* (2013.01); *H01Q 7/00* (2013.01); *H01Q 9/0421* (2013.01); *H01Q 9/42* (2013.01); *H01Q 21/28* (2013.01); *H04B 5/26* (2024.01); *H04B 5/48* (2024.01); *H04B 5/70* (2024.01); *H05K 1/0278* (2013.01); *H05K 5/03* (2013.01); *H10K 59/40* (2023.02); *H04B 5/72* (2024.01)

(58) Field of Classification Search
CPC ...... H01Q 1/2258; H01Q 1/2266; H01Q 1/24; H01Q 1/273; H01Q 1/36; H01Q 1/42; H01Q 1/48; H01Q 13/10; H01Q 13/18; H01Q 21/00; H01Q 5/364; H01Q 7/04; H01Q 9/0421; H01Q 9/0428; H01Q 9/045; G06F 1/1626; G06F 3/041; G06F 3/0412; G06F 3/0445; G06F 3/0446; G06F 1/1637; G06F 1/1643; G06F 1/1698; G06F 2203/04107; G06F 3/0443; H04B 5/0031; H04B 5/0081; H04B 5/0037; H04B 5/02; H04B 1/3827; H04B 15/00; H04B 5/00; H04B 5/0025; H04B 5/0075; H04M 1/0266; H04M 1/72412; H04M 2250/22; H04M 1/0237; H04M 1/0249; H04M 1/0254; H04M 1/0274; H04M 1/0277; H04M 1/11; H04M 1/185; H04M 1/72478

See application file for complete search history.

(56) References Cited

U.S. PATENT DOCUMENTS

| | | |
|---|---|---|
| 2011/0006953 A1* | 1/2011 | Chiang ................ H01Q 1/2266 343/702 |
| 2011/0210825 A1 | 9/2011 | Murakami et al. |
| 2011/0222248 A1 | 9/2011 | Sakai et al. |
| 2011/0241949 A1 | 10/2011 | Nickel et al. |
| 2012/0028679 A1 | 2/2012 | Ozasa |
| 2012/0133597 A1 | 5/2012 | Chen |
| 2012/0223865 A1 | 9/2012 | Li et al. |
| 2013/0044074 A1 | 2/2013 | Park et al. |
| 2013/0050032 A1 | 2/2013 | Shiu et al. |
| 2013/0052947 A1 | 2/2013 | Kole et al. |
| 2013/0078917 A1 | 3/2013 | Cho et al. |
| 2013/0082895 A1* | 4/2013 | Shiu ........................ H01Q 7/00 343/866 |
| 2013/0140965 A1 | 6/2013 | Franklin et al. |
| 2013/0229362 A1 | 9/2013 | Liu et al. |
| 2013/0265199 A1 | 10/2013 | Koskiniemi et al. |
| 2013/0293424 A1 | 11/2013 | Zhu et al. |
| 2013/0318766 A1 | 12/2013 | Kiple et al. |
| 2014/0028619 A1 | 1/2014 | Huang et al. |
| 2014/0080411 A1 | 3/2014 | Konanur et al. |
| 2014/0133074 A1 | 5/2014 | Zahler et al. |
| 2014/0170975 A1 | 6/2014 | Laio |
| 2014/0213178 A1* | 7/2014 | Wolff ..................... H01Q 1/243 455/41.1 |
| 2014/0306288 A1* | 10/2014 | Adachi ............... H01L 27/1218 257/347 |
| 2015/0207913 A1 | 7/2015 | Nakano et al. |

FOREIGN PATENT DOCUMENTS

| | | |
|---|---|---|
| EP | 2869398 B1 | 5/2015 |
| KR | 10-2014-0024543 A | 3/2014 |
| TW | 201409500 A | 3/2014 |
| WO | 2009014366 A3 | 1/2009 |
| WO | 2013149515 A1 | 10/2013 |
| WO | 2013/190119 A2 | 12/2013 |

* cited by examiner

ELECTRONIC DEVICE WITH NEAR-FIELD ANTENNA OPERATING THROUGH DISPLAY

This application is a continuation of U.S. patent application Ser. No. 17/527,906, filed Nov. 16, 2021, which is a continuation of U.S. patent application Ser. No. 16/596,593, filed Oct. 8, 2019, now U.S. Pat. No. 11,205,832, which is a division of U.S. patent application Ser. No. 15/625,903, filed Jun. 16, 2017, now U.S. Pat. No. 10,461,395, which is a continuation of U.S. patent application Ser. No. 15/090,781, filed Apr. 5, 2016, now U.S. Pat. No. 9,685,690, which is a continuation of U.S. patent application Ser. No. 14/259,861, filed Apr. 23, 2014, now U.S. Pat. No. 9,356,661. The disclosures of these applications are hereby incorporated by reference herein in their entireties.

BACKGROUND

This relates to electronic devices, and more particularly, to antennas for electronic devices with wireless communications circuitry.

Electronic devices such as portable computers and cellular telephones are often provided with wireless communications capabilities. For example, electronic devices may use long-range wireless communications circuitry such as cellular telephone circuitry to communicate using cellular telephone bands. Electronic devices may use short-range wireless communications circuitry such as wireless local area network communications circuitry to handle communications with nearby equipment. Electronic devices may also be provided with satellite navigation system receivers and other wireless circuitry such as near-field communications circuitry. Near-field communications schemes involve electromagnetically coupled communications over short distances, typically 20 cm or less.

To satisfy consumer demand for small form factor wireless devices, manufacturers are continually striving to implement wireless communications circuitry such as antenna components using compact structures. At the same time, there is a desire for wireless devices to cover multiple communications bands. For example, it may be desirable for a wireless device to cover a near-field communications band while simultaneously covering a non-near-field (far field) band.

Because antennas have the potential to interfere with each other and with components in a wireless device, care must be taken when incorporating antennas into an electronic device. Moreover, care must be taken to ensure that the antennas and wireless circuitry in a device are able to exhibit satisfactory performance over a range of operating frequencies.

It would therefore be desirable to be able to provide improved wireless communications circuitry for wireless electronic devices.

SUMMARY

An electronic device may have a housing in which a display is mounted. The electronic device may be a portable electronic device having a wrist strap for attaching the electronic device to the wrist of a user. The electronic device may have wireless circuitry such as near-field communications circuitry and non-near-field communications circuitry.

A display cover layer and a transparent inner display member may overlap a display pixel layer that has an array of display pixels for displaying images to a user. The display cover layer may have an outer surface and an opposing inner surface. The transparent display member may have a curved or planar outer surface that mates with the inner surface of the display cover layer.

A touch sensor layer may be interposed between the display pixel layer and the transparent display member. A ferromagnetic shielding layer may be mounted below the display pixel layer. A flexible printed circuit containing coils of metal signal lines that form a near-field communications loop antenna may be interposed between the ferromagnetic shielding layer and the display pixel layer.

A non-near-field antenna such as an inverted-F antenna may have a resonating element mounted on an inner surface of the display cover layer. The resonating element may be interposed between the transparent display member and the display cover layer.

DETAILED DESCRIPTION

Electronic devices may be provided with wireless circuitry. The wireless circuitry may include near-field communications circuitry. For example, a near-field communications transmitter-receiver ("transceiver") may use a near-field communications antenna to transmit and receive near-field electromagnetic signals at a frequency such as 13.56 MHz. Near-field communications schemes involve near-field electromagnetic coupling between near-field antennas that are separated by a relatively small distance (e.g., 20 cm or less). The near-field communications antennas may be loop antennas. The wireless circuitry may also include cellular network transceiver circuitry, wireless local area network transceiver circuitry, satellite navigation system circuitry, or other non-near-field communications circuitry. The non-near-field communications circuitry can use an antenna to handle radio-frequency signals at frequencies of 700 MHz to 2700 MHz (e.g., 2.4 GHz), 5 GHz, or other suitable frequencies.

The wireless communications circuitry in an electronic device may be used to support wireless communications in multiple wireless communications bands. The wireless communications circuitry may include antenna structures that include loop antennas, inverted-F antennas, strip antennas, planar inverted-F antennas, slot antennas, hybrid antennas that include antenna structures of more than one type, or other suitable antennas.

Antenna structures may, if desired, be formed from conductive electronic device structures such as conductive electronic device housing structures, stamped metal foil, wires, metal portions of electronic components, and conductive traces such as metal traces on dielectric substrates. The dielectric substrates on which the conductive traces are formed may be printed circuit substrates (e.g., rigid printed circuit boards formed from fiberglass-filled epoxy or other rigid printed circuit board material and/or flexible printed circuits formed from flexible sheets of polyimide or other flexible polymer layers), plastic carriers, glass substrates, ceramic substrates, or other dielectric support structures. If desired, flexible printed circuits containing antenna structures and other antennas may be mounted to structures in an electronic device using adhesive.

Illustrative electronic devices that may be provided with wireless communications circuitry are shown in FIGS. 1, 2, 3, 4, and 5.

Figure 1:
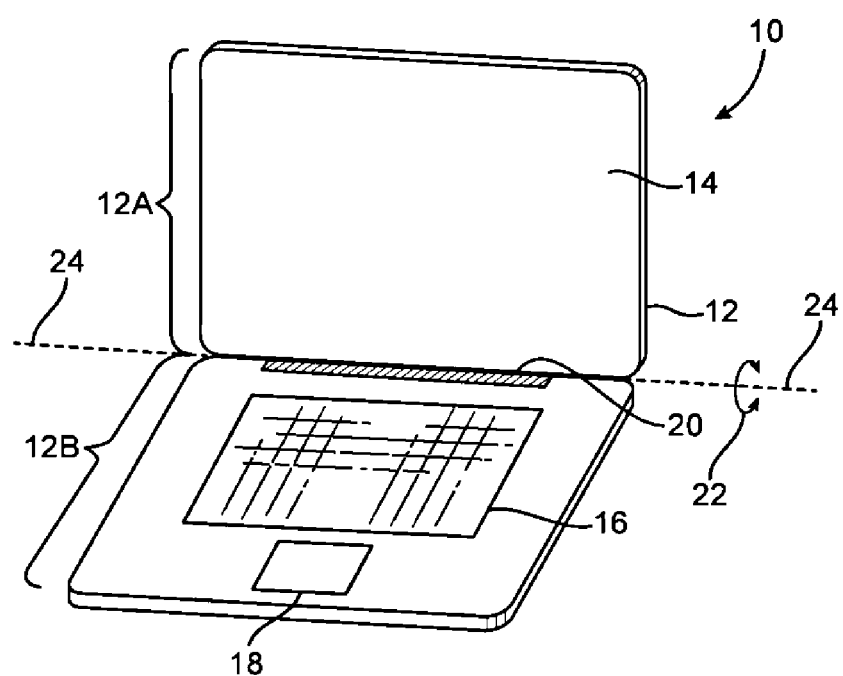
FIG. 1 is a perspective view of an illustrative electronic device such as a laptop computer with wireless circuitry in accordance with an embodiment.

Electronic device 10 of FIG. 1 has the shape of a laptop computer and has upper housing 12A and lower housing 12B with components such as keyboard 16 and touchpad 18. Device 10 has hinge structures 20 (sometimes referred to as a clutch barrel) to allow upper housing 12A to rotate in directions 22 about rotational axis 24 relative to lower housing 12B. Display 14 is mounted in housing 12A. Upper housing 12A, which may sometimes be referred to as a display housing or lid, is placed in a closed position by rotating upper housing 12A towards lower housing 12B about rotational axis 24.

Figure 2:
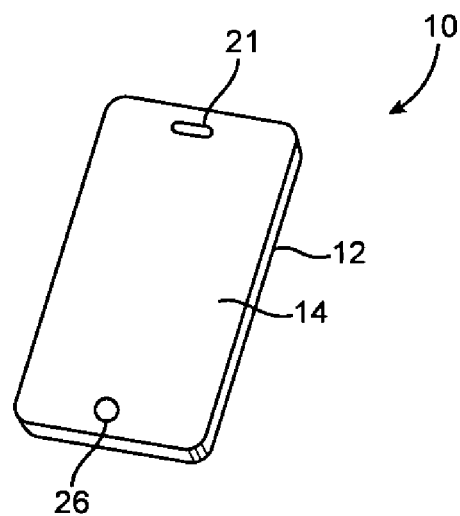
FIG. 2 is a perspective view of an illustrative electronic device such as a handheld electronic device with wireless circuitry in accordance with an embodiment.

FIG. 2 shows an illustrative configuration for electronic device 10 based on a handheld device such as a cellular telephone, music player, gaming device, navigation unit, or other compact device. In this type of configuration for device 10, device 10 has opposing front and rear surfaces. Display 14 is mounted on a front face of device 10. Display 14 may have an exterior layer that includes openings for components such as button 26 and speaker port 21.

Figure 3:
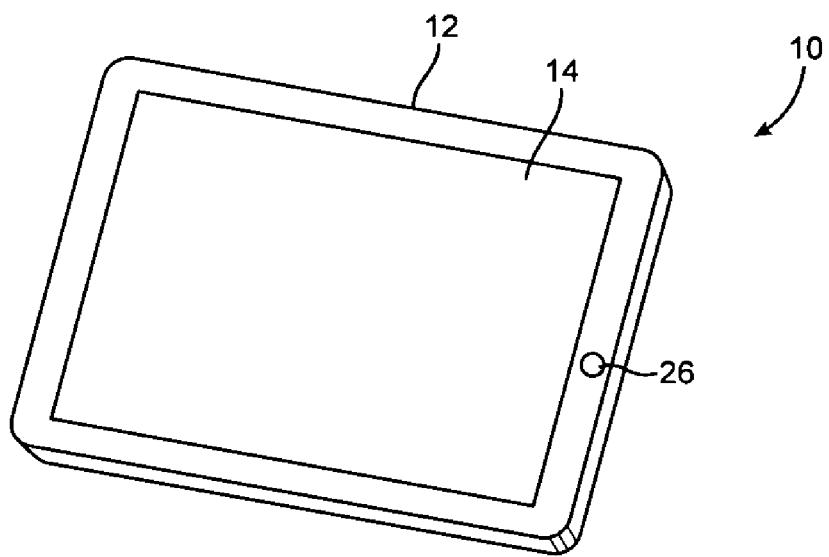
FIG. 3 is a perspective view of an illustrative electronic device such as a tablet computer with wireless circuitry in accordance with an embodiment.

In the example of FIG. 3, electronic device 10 is a tablet computer. In electronic device 10 of FIG. 3, device 10 has opposing planar front and rear surfaces. Display 14 is mounted on the front surface of device 10. As shown in FIG. 3, display 14 may have an opening to accommodate button 26.

Figure 4:
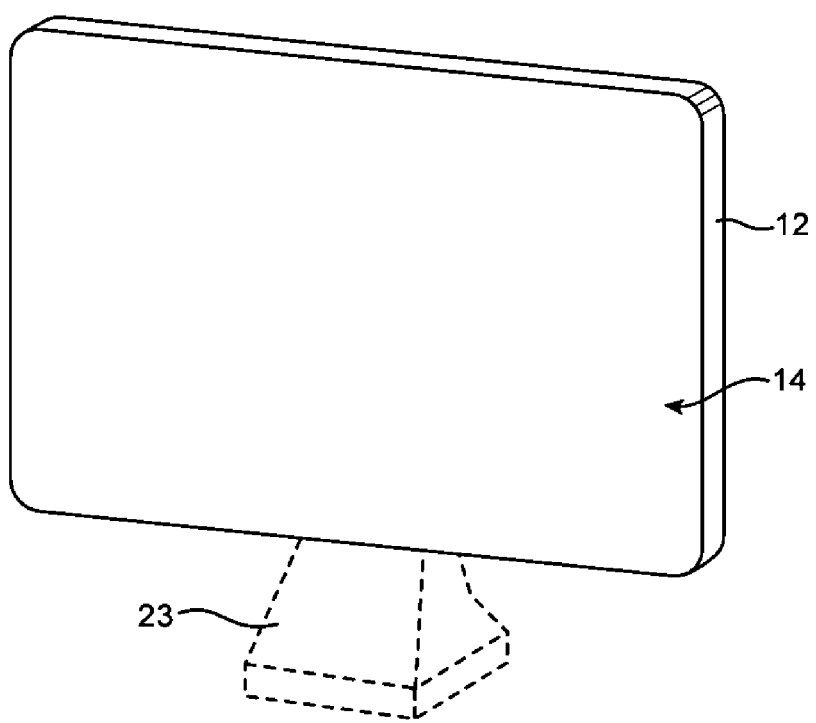
FIG. 4 is a perspective view of an illustrative electronic device such as a display for a computer or television with wireless circuitry in accordance with an embodiment.

FIG. 4 shows an illustrative configuration for electronic device 10 in which device 10 is a computer display, a computer that has an integrated computer display, or a television. Display 14 is mounted on a front face of device 10. With this type of arrangement, housing 12 for device 10 may be mounted on a wall or may have an optional structure such as support stand 23 to support device 10 on a flat surface such as a table top or desk.

Figure 5A:
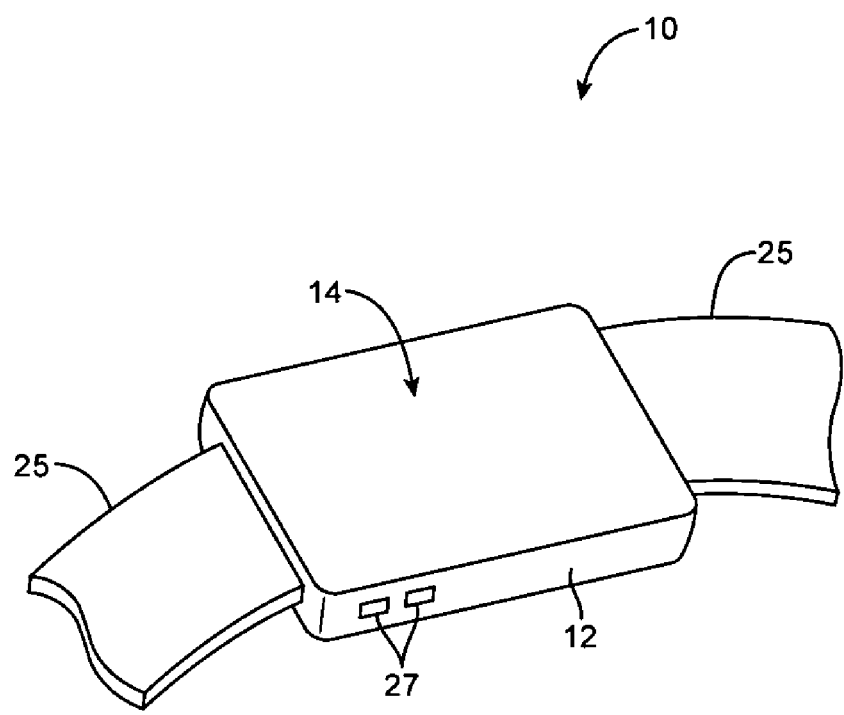
FIG. 5A is a perspective view of an illustrative electronic device such as a wrist-watch device with wireless circuitry in accordance with an embodiment.
Figure 5B:
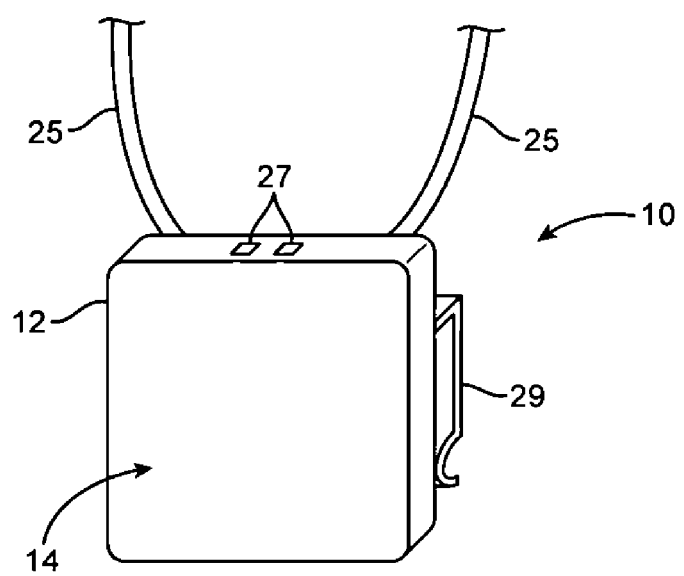
FIG. 5B is a perspective view of an illustrative electronic device such as a pendant or pin device with wireless circuitry in accordance with an embodiment.

FIG. 5A shows an illustrative configuration for electronic device 10 in which device 10 is a wrist-watch device. Display 14 may be mounted on the front face of device 10. Buttons 27 or other user input-output components may be mounted on the edges of device housing 12. Device 10 may have a strap attached to housing 12 such as wrist strap 25 so that device 10 may be attached to the wrist of a user. If desired, devices such as device 10 may be worn as pendant type devices (e.g., wrist strap 25 may serve as a neck cord as shown in FIG. 5B). FIG. 5B also shows how a pin such as spring clip structure 29 may be provided on device housing 12 to allow device 10 to be pinned to the clothing of a user. If desired, strap 25 may be detached.

Electronic device 10 may, in general, be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a cellular telephone, or a media player. Device 10 may also be a television, a set-top box, a desktop computer, a computer monitor into which a computer has been integrated, a television, a computer monitor, or other suitable electronic equipment. The configurations for device 10 that are shown in FIGS. 1, 2, 3, 4, and 5 are merely illustrative.

Display 14 in devices such as devices 10 of FIGS. 1, 2, 3, 4, and 5 may be a liquid crystal display, an organic light-emitting diode display, a plasma display, an electrophoretic display, an electrowetting display, a display using other types of display technology, or a display that includes display structures formed using more than one of these display technologies. If desired, a touch sensor may be incorporated into display 14. For example, a layer in display 14 that contains display pixel structures or a separate substrate may be provided with an array of transparent conductive electrodes such as indium tin oxide electrodes. The array of transparent electrodes may be used to gather capacitive touch sensor measurements (i.e., the array of electrodes may be used to form a capacitive touch sensor for display 14).

Electronic devices such as electronic devices 10 of FIGS. 1, 2, 3, 4, and 5 may have antenna structures for handling near-field communications (e.g., communications in a near-field communications band such as a 13.56 MHz band or other near-field communications band) and non-near-field communications (sometimes referred to as far field communications) such as cellular telephone communications, wireless local area network communications, and satellite navigation system communications. Near-field communications typically involve communication distances of less than about 20 cm and involve magnetic (electromagnetic) near-field coupling between near-field antennas such as loop antennas. Far field communications typically involved communication distances of multiple meters or miles.

Electronic devices such as devices 10 of FIGS. 1, 2, 3, 4, and 5 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Figure 6:
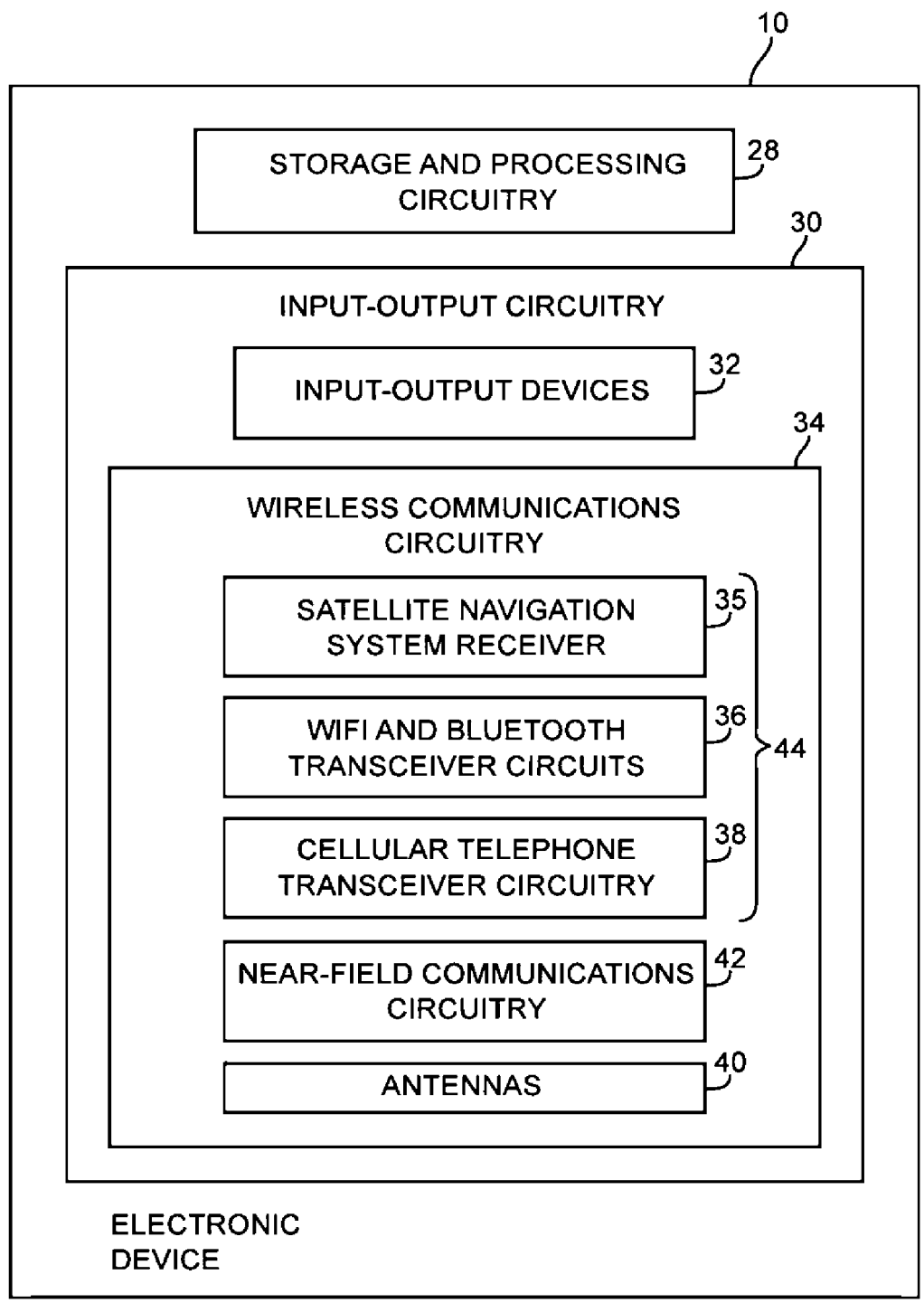
FIG. 6 is a schematic diagram of an illustrative electronic device with wireless communications circuitry in accordance with an embodiment.

A schematic diagram of an illustrative configuration that may be used for an electronic device such as device 10 of FIGS. 1, 2, 3, 4, and 5 is shown in FIG. 6. As shown in FIG. 6, electronic device 10 may include control circuitry such as storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. The processing circuitry may be based on one or more microprocessors, microcontrollers, digital signal processors, baseband processors, power management units, audio codec chips, application specific integrated circuits, etc.

Storage and processing circuitry 28 may be used to run software on device 10, such as internet browsing applications, voice-over-internet-protocol (VOIP) telephone call applications, email applications, media playback applications, operating system functions, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, near-field communications protocols, etc.

Circuitry 28 may be configured to implement control algorithms that control the use of antennas in device 10. For example, circuitry 28 may perform signal quality monitoring operations, sensor monitoring operations, and other data gathering operations and may, in response to the gathered data and information on which communications bands are to be used in device 10, control which antenna structures within device 10 are being used to receive and process data and/or may adjust one or more switches, tunable elements, or other adjustable circuits in device 10 to adjust antenna performance. As an example, circuitry 28 may control which of two or more antennas is being used to receive or transmit near-field or non-near-field wireless signals, which antenna is being used to handle incoming radio-frequency signals, may control which of two or more antennas is being used to transmit radio-frequency signals, may control the process of routing incoming data streams over two or more antennas in device 10 in parallel, may tune an antenna to cover a desired communications band, may perform time-division multiplexing operations to share antenna structures between near-field and non-near-field communications circuitry, to share a non-near-field communications transceiver between multiple non-near-field antennas, to share a near-field communications transceiver between multiple near-field antennas, etc.

In performing these control operations, circuitry 28 may open and close switches (e.g., switches associated with one or more multiplexers or other switching circuitry), may turn on and off receivers and transmitters, may adjust impedance matching circuits, may configure switches in front-end-module (FEM) radio-frequency circuits that are interposed between radio-frequency transceiver circuitry and antenna structures (e.g., filtering and switching circuits used for impedance matching and signal routing), may adjust switches, tunable circuits, and other adjustable circuit elements that are formed as part of an antenna or that are coupled to an antenna or a signal path associated with an antenna, and may otherwise control and adjust the components of device 10.

Input-output circuitry 30 may be used to allow data to be supplied to device 10 and to allow data to be provided from device 10 to external devices. Input-output circuitry 30 may include input-output devices 32. Input-output devices 32 may include touch screens, buttons, joysticks, click wheels, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 32 and may receive status information and other output from device 10 using the output resources of input-output devices 32. The sensors in input-output devices 32 may gather information about the operating environment of device 10 and/or may gather user input. The sensors in devices 32 may include sensors such as a touch sensor, an accelerometer, a compass, a proximity sensor, an ambient light sensor, and other sensors. Sensor data may be used in controlling antenna operation (e.g., in switching between antennas, tuning antennas, etc.).

Wireless communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Wireless communications circuitry 34 may include satellite navigation system receiver circuitry 35 such as Global Positioning System (GPS) receiver circuitry (e.g., circuitry for receiving satellite positioning signals at 1575 MHz) or may include satellite navigation system receiver circuitry associated with other satellite navigation systems.

Wireless local area network transceiver circuitry 36 in wireless communications circuitry 34 may handle 2.4 GHz and 5 GHz bands for WiFi® (IEEE 802.11) communications and may handle the 2.4 GHz Bluetooth® communications band.

Circuitry 34 may use cellular telephone transceiver circuitry 38 for handling wireless communications in cellular telephone bands such as bands in frequency ranges of about 700 MHz to about 2700 MHz or bands at higher or lower frequencies.

Wireless communications circuitry 34 may include near-field communications circuitry 42. Near-field communications circuitry 42 may handle near-field communications at frequencies such as the near-field communications frequency of 13.56 MHz or other near-field communications frequencies of interest.

Circuitry 44 such as satellite navigation system receiver circuitry 35, wireless local area network transceiver circuitry 36, and cellular telephone transceiver circuitry 38 that does not involve near-field communications may sometimes be referred to as non-near-field communications circuitry or far field communications circuitry.

If desired, communications circuitry 34 may include circuitry for other short-range and long-range wireless links. For example, wireless communications circuitry 34 may include wireless circuitry for receiving radio and television signals, paging circuits, etc. In near-field communications, wireless signals are typically conveyed over distances of less than 20 cm. In WiFi® and Bluetooth® links and other short-range wireless links, wireless signals are typically used to convey data over 20 cm (e.g., 20 cm to hundreds of meters). In cellular telephone links and other long-range links, wireless signals are typically used to convey data over hundreds of meters or thousands of meters.

Wireless communications circuitry 34 may include antennas 40. Antennas 40 may include near-field and non-near-field antennas. Antennas 40 may be formed using any suitable types of antenna. For example, antennas 40 may include antennas with resonating elements that are formed from loop antenna structures, patch antenna structures, inverted-F antenna structures, closed and open slot antenna structures, planar inverted-F antenna structures, helical antenna structures, strip antennas, monopoles, dipoles, hybrids of these designs, etc. Different types of antennas may be used for different bands and combinations of bands. For example, one type of antenna may be used in forming a local wireless link antenna and another type of antenna may be used in forming a remote wireless link or one type of antenna may be used in forming a non-near-field antenna while another type of antenna may be used in forming a near-field antenna.

Figure 7:
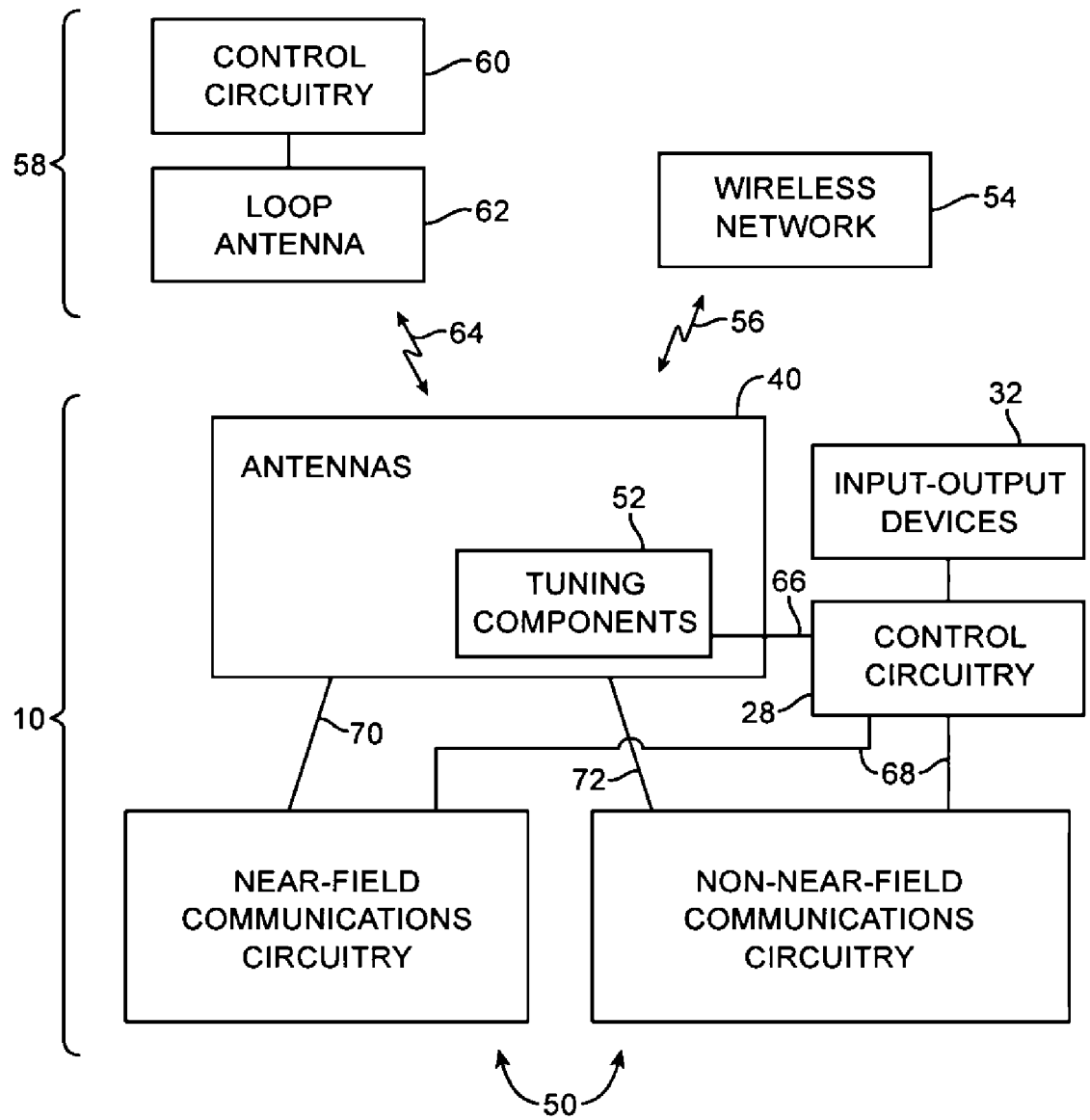
FIG. 7 is a diagram of a system in which antenna structures in an electronic device are being used to wirelessly communicate with external electrical equipment using near-field communications and non-near-field communications in accordance with an embodiment.

FIG. 7 is a schematic diagram showing how antennas 40 in device 10 may be used by near-field communications circuitry 42 and non-near-field communications circuitry 44. As shown in FIG. 7, electronic device 10 includes control circuitry 28 and input-output devices 32. Control circuitry 28 may use input-output devices 32 to provide output to a user and to receive input. Control circuitry 28 may use wireless transceiver circuitry 50 and antennas 40 to communicate with external equipment over one or more wireless communications bands including bands for non-near-field communications and near-field communications. Antennas 40 may include one or more near-field-communications antennas and/or one or more non-near-field communications antennas.

Near-field communications circuitry 42 and non-near-field communications circuitry 44 may be coupled to antennas 40. Near-field communications circuitry 42 (e.g., a near-field communications transceiver) may use a near-field communications antenna to communicate with external near-field communications equipment 58 over near-field communications link 64. Non-near-field communications circuitry such as radio-frequency transceiver circuitry 44 may use a non-near-field antenna to communicate with a cellular telephone network, a wireless local area network such as an external network of computing equipment, a cellular telephone, a music player, a laptop computer, a desktop computer, a computer integrated into a display, a wireless television, or other far field (non-near-field) wireless network equipment 54 over non-near-field communications wireless link 56 (e.g., a Bluetooth® link, a WiFi® link, a cellular telephone link, etc.).

External equipment such as external equipment 58 may communicate with near-field communications circuitry 42 via magnetic induction. Equipment 58 may include a loop antenna such as loop antenna 62 that is controlled by control circuitry 60. Loop antenna 62 and one or more loop antennas in antennas 40 may be electromagnetically coupled to support near-field wireless communications when loop antenna 62 and the loop antenna(s) in structures 40 are within an appropriately close distance of each other such as 20 cm or less, as indicated by near-field communications signals 64 of FIG. 7.

Device 10 may use near-field communications circuitry 42 and the near-field communications loop antenna(s) of antennas 40 to communicate with external near-field communications equipment 58 using passive or active communications. In passive communications, device 10 may use near-field communications circuitry 42 and a near-field communications antenna to modulate electromagnetic signals 64 from equipment 58. In active communications, near-field communications circuitry 42 and a near-field communications antenna may transmit radio-frequency electromagnetic signals 64 to external equipment 58.

To provide antennas 40 with the ability to cover communications frequencies of interest, antennas 40 may be provided with circuitry such as filter circuitry (e.g., one or more passive filters and/or one or more tunable filter circuits). Discrete components such as capacitors, inductors, and resistors may be incorporated into the filter circuitry. Capacitive structures, inductive structures, and resistive structures may also be formed from patterned metal structures (e.g., part of an antenna).

If desired, antennas 40 may be provided with adjustable circuits such as tunable circuitry 52. Tunable circuitry 52 may be controlled by control signals from control circuitry 28. For example, control circuitry 28 may supply control signals to tunable circuitry 52 via control path 66 during operation of device 10 whenever it is desired to tune antennas 40 to cover a desired communications band (e.g., a desired non-near-field communications band). Paths 68 may be used to convey data between control circuitry 28 and transceiver circuitry 50.

Passive filter circuitry in antennas 40 may help antennas 40 exhibit antenna resonances in communications bands of interest (e.g., passive filter circuitry in antennas 40 may short together different portions of antennas 40 and/or may form open circuits or pathways of other impedances between different portions of antennas 40 to ensure that desired antenna resonances are produced).

Transceiver circuitry 50 may be coupled to antennas 40 by signal paths such as signal paths 70 and 72. Signal paths 70 and 72 may include transmission lines, portions of conductive housing structures, ground plane structures, traces on printed circuits, or other conductive paths.

Impedance matching circuitry formed from components such as inductors, resistors, and capacitors may be used in matching the impedance of antennas 40 to the impedance of transmission line structures coupled to antennas 40. Filter circuitry may also be provided in the transmission line structures and/or antennas 40. Matching network components may be provided as discrete components (e.g., surface mount technology components) or may be formed from housing structures, printed circuit board structures, traces on plastic supports, etc. Components such as these may also be used in forming passive filter circuitry in antennas 40 and tunable circuitry 52 in antennas 40.

A transmission line may be coupled between transceiver 44 and antenna feed structures associated with antennas 40. As an example, antennas 40 may form one or more non-near-field communications antennas such as one or more inverted-F antennas each having an antenna feed with a positive antenna feed terminal and a ground antenna feed terminal. For each non-near-field antenna, a positive transmission line conductor may be coupled to the positive antenna feed terminal and a ground transmission line conductor may be coupled to the ground antenna feed terminal. Each near-field communications antenna may have a pair of antenna feed terminals (e.g., a pair of feed terminals for receiving differential near-field communications signals from near-field communications circuitry 42). If desired, other types of antenna feed arrangements may be used to couple non-near-field communications transceiver 44 to non-near-field antennas and to couple near-field communications transceiver 42 to near-field antennas.

Tunable circuitry 52 may be formed from one or more tunable circuits such as circuits based on capacitors, resistors, inductors, and switches. Tunable circuitry 52 and filter circuitry in antennas 40 may be implemented using discrete components mounted to a printed circuit such as a rigid printed circuit board (e.g., a printed circuit board formed from glass-filled epoxy) or a flexible printed circuit formed from a sheet of polyimide or a layer of other flexible polymer or may be implemented using circuitry on a plastic carrier, a glass carrier, a ceramic carrier, or other dielectric substrate. During operation of device 10, control circuitry 28 may issue commands on path 66 to adjust switches, variable components, and other adjustable circuitry in tunable circuitry 52, thereby tuning antennas 40. If desired, tunable circuitry 52 may include one or more inductors. A switch circuit may be used to selectively switch a desired number of the inductors into use. By varying the inductance of tunable circuitry 52 in this way, antennas 40 can be tuned to cover desired communications bands. Tunable circuitry 52 may also include one or more capacitors that are selectively switched into use with a switching circuit to tune antennas 40. Capacitance adjustments and inductance adjustments may be made using a tunable circuit with adjustable capacitors and inductors and/or separately adjustable capacitor circuits and inductor circuits may be used in tuning antennas 40. If desired, antenna(s) 40 may include one or more non-tunable (fixed) antennas.

Figure 8:
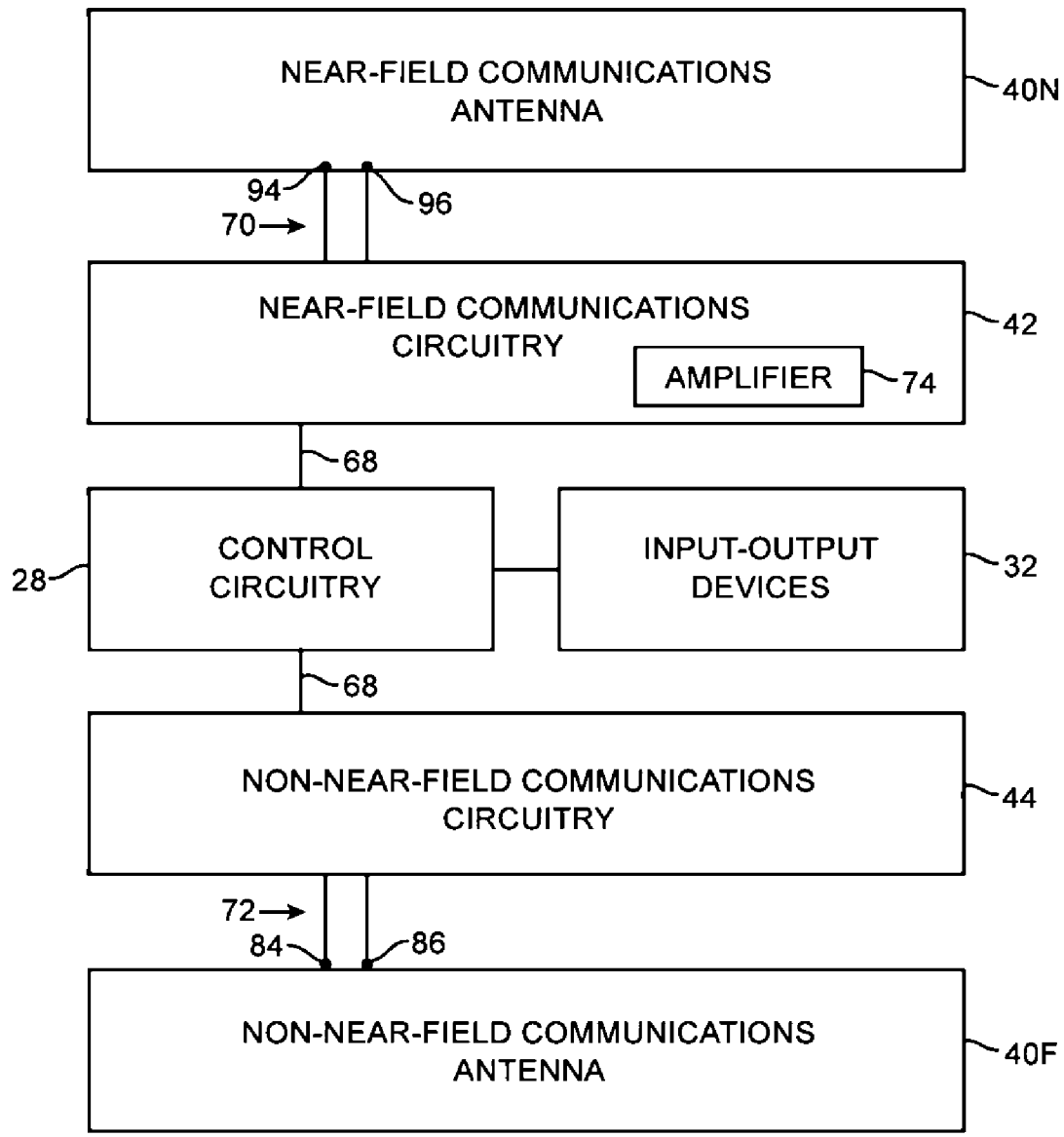
FIG. 8 is a diagram showing how an electronic device may have a near-field antenna and a non-near-field antenna in accordance with an embodiment.

FIG. 8 is a schematic diagram of illustrative wireless circuitry 34 in device 10 in a configuration in which antennas 40 include near-field communications antenna 40N and non-near-field (far field) communications antenna 40F.

Non-near-field communications circuitry 44 may wirelessly communicate with external equipment such as equipment 54 of FIG. 7 using non-near-field communications antenna 40F. Positive antenna feed terminal 84 and ground antenna feed terminal 86 form a non-near-field communications antenna feed that is coupled to non-near-field communications circuitry 44 (e.g., a non-near-field communications transceiver such as a cellular telephone transceiver, wireless local area network transceiver, etc.) by a pair of transmission line conductors in path 70.

Near-field communications circuitry 42 may wirelessly communicate with external near-field communications equipment 58 using near-field communications antenna 40N. Near-field communications circuitry 42 (e.g., a near-field communications transceiver operating at 13.56 MHz or other suitable near-field communications frequency) may be coupled to antenna structures 40 using a pair of conductive lines in path 70, which are coupled to respective near-field antenna feed terminals 94 and 96. Near-field communications circuitry 42 may have a pair of differential signal terminals (sometimes referred to as +V and −V terminals) for handling differential near-field communications signals. The two differential signal terminals of near-field communications circuitry 42 may be coupled respectively to the two signal lines in path 70. Near-field communications circuitry 42 may include an amplifier such as amplifier 74. Amplifier 74 may strengthen near-field communications signals so that near-field communications antenna 40N may operate satisfactorily, even in the presence of intervening structures between antenna 40N and loop antenna 62 such as intervening display structures.

Antenna 40F may be formed using a planar inverted-F antenna, a loop antenna, a monopole, a dipole, a patch antenna, a slot antenna, or any other suitable type of antenna. In the illustrative configuration of FIG. 9, antenna 40F has been formed using an inverted-F antenna design.

Figure 9:
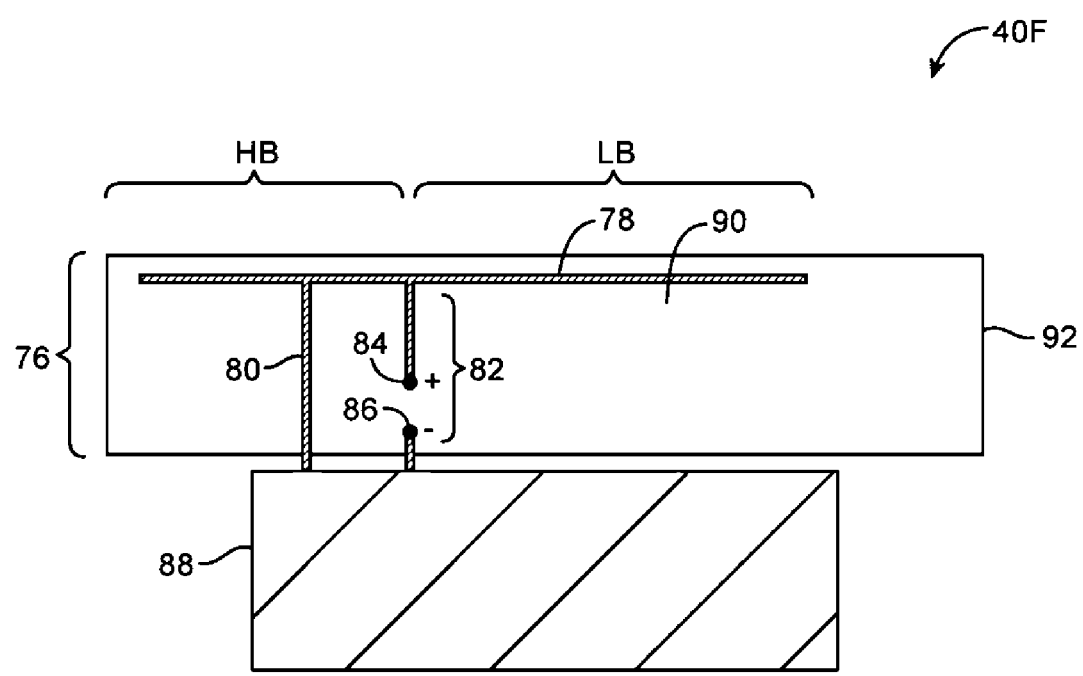
FIG. 9 is a diagram of an illustrative non-near-field antenna such as an inverted-F antenna in accordance with an embodiment.

As shown in FIG. 9, antenna 40F may include inverted-F antenna resonating element 76 and a conductive structure such as antenna ground 88. Antenna resonating element 76 and antenna ground 88 may be formed from metal traces on a flexible printed circuit, metal traces on a rigid printed circuit board, metal traces on other dielectric carriers, portions of an electronic device housing such as a metal midplate structure or internal frame structures, metal housing walls or other portions of housing 12, conductive structures such as metal portions of electrical components in device 10, or other conductive structures. As an example, inverted-F antenna resonating element 76 may be formed from metal traces on dielectric substrate 92. Substrate 92 may be a flexible printed circuit having a flexible dielectric substrate, a rigid printed circuit board, a glass or plastic structure, or other dielectric substrate.

Antenna resonating element 76 may include main antenna resonating element arm 78 (e.g., an arm formed from metal traces on a printed circuit or other dielectric substrate). Main antenna resonating element arm 78 may have one or more branches. For example, arm 78 may have a low band arm LB for producing a low communications band resonance and a high band arm HB for producing a high communications band resonance. Arm 78 may be separated from ground plane 88 by a dielectric-filled opening such as gap 90. Gap 90 may contain plastic, glass, ceramic, air, or other dielectric materials. Non-near-field communications antenna return path 80 in non-near-field communications antenna 40F may bridge gap 90. Non-near-field communications antenna feed path 82 may bridge gap 90 in parallel with return path 80. Antenna feed terminals such as positive antenna feed terminal 84 and ground antenna feed terminal 86 may form a non-near-field communications antenna feed within antenna feed path 82. The conductive structures of antenna return path 80 and antenna feed path 82 may be formed from metal traces on printed circuits, metal traces on plastic carriers, conductive housing structures, or other conductive structures in device 10.

Impedance matching circuitry, filter circuitry, and tunable circuitry 52 of FIG. 7 may be interposed in paths that bridge gap 90 such as path 80, feed path 82, or one or more parallel tuning paths or may be formed in other portions of antenna resonating element 76 and/or may be incorporated into ground structures such as antenna ground 88.

Figure 10:
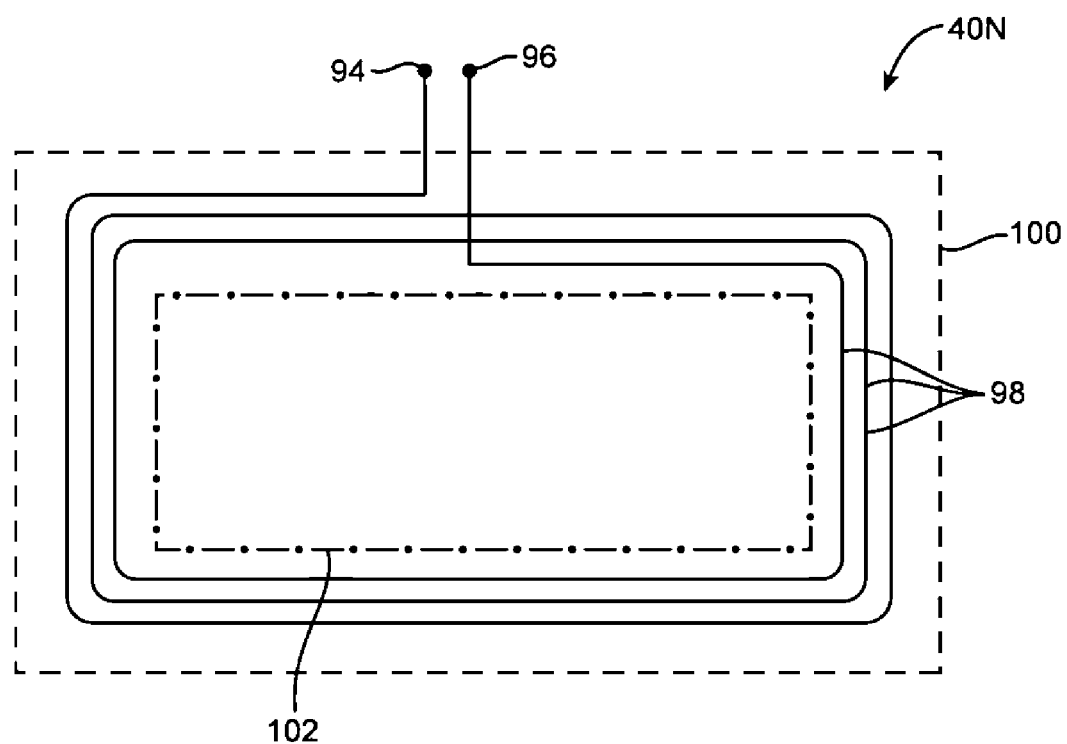
FIG. 10 is a diagram of an illustrative near-field antenna such as a near-field communications loop antenna in accordance with an embodiment.

An illustrative near-field communications loop antenna configuration that may be used for near-field communications antenna 40N is shown in FIG. 10. As shown in FIG. 10, near-field communications antenna 40N has near-field communications antenna terminals 94 and 96 and is formed from one or more coils (turns) of metal signal lines such as lines 98. In the illustrative arrangement of FIG. 10, the coils of loop antenna 40N are rectangular. If desired, the coils of loop antenna 40N may be circular, may be oval, may be triangular, may have a combination of straight and curved sections, or may have other suitable shapes If desired, display 14 or other electrical components may overlap some or all of antenna 40N. As shown in FIG. 10, for example, an electrical component such as a display may have a footprint such as footprint 100 that overlaps the coils of antenna 40N or may have a footprint such as footprint 102 that substantially overlaps antenna 40N but is surrounded by coils 98. In these configurations, coils 98 run along the periphery of the overlapping component (i.e., coils 98 follow the rectangular edge of rectangular component footprint 100 or 102 and are therefore located just inside or outside of the edge of the component). The component that overlaps antenna 40N may be a rectangular organic light-emitting diode display having a rectangular periphery or may be any other rectangular electrical component. The component that overlaps antenna 40N may also have a non-rectangular periphery. Other fully and partially overlapping arrangements may be used if desired. The illustrative arrangements of FIG. 10 are merely illustrative.

Figure 11:
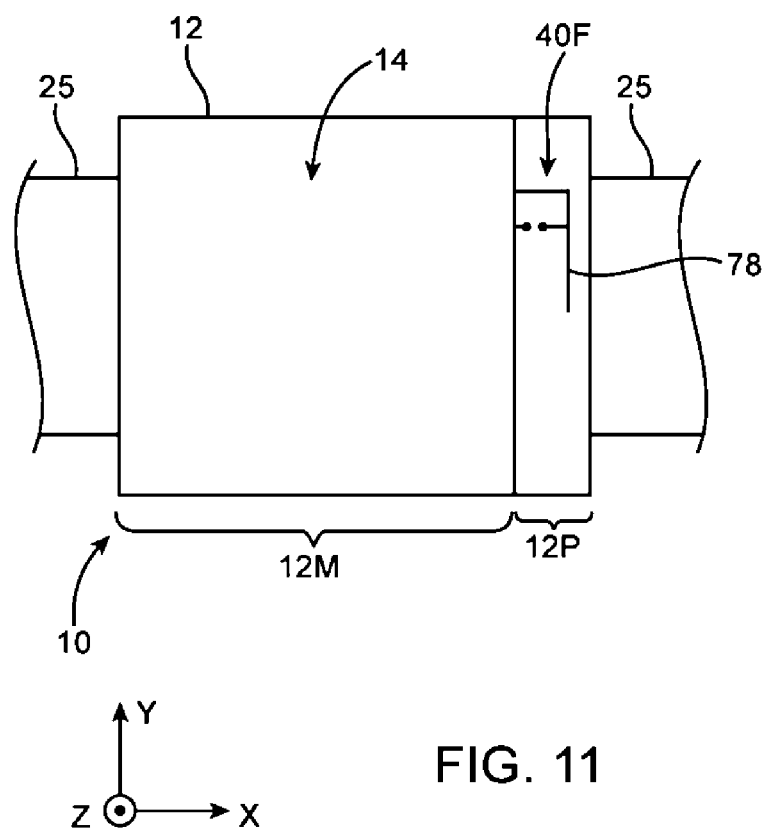
FIG. 11 is a diagram of an illustrative wrist-watch device with an antenna formed adjacent to a display in accordance with an embodiment.

FIG. 11 shows how housing 12 of electronic device 10 may have a first portion such as portion 12M that includes display 14 and a second portion such as portion 12P that includes non-near-field antenna 40F. Portion 12M may be formed from metal or other suitable housing materials. Portion 12P may include an antenna cover structure formed from plastic or other dielectric materials so that antenna signals associated with antenna 40F may be conveyed through portion 12P. By using dielectric materials to enclose antenna 40F and by laterally offsetting antenna 40F in lateral dimension X to the side of display 14, antenna 40F can operate satisfactorily (e.g., antenna 40F can operate without interference from conductive structures in display 14 and/or housing 12M). If desired, housing 12M may serve as an antenna ground for antenna 40F.

Figure 12:
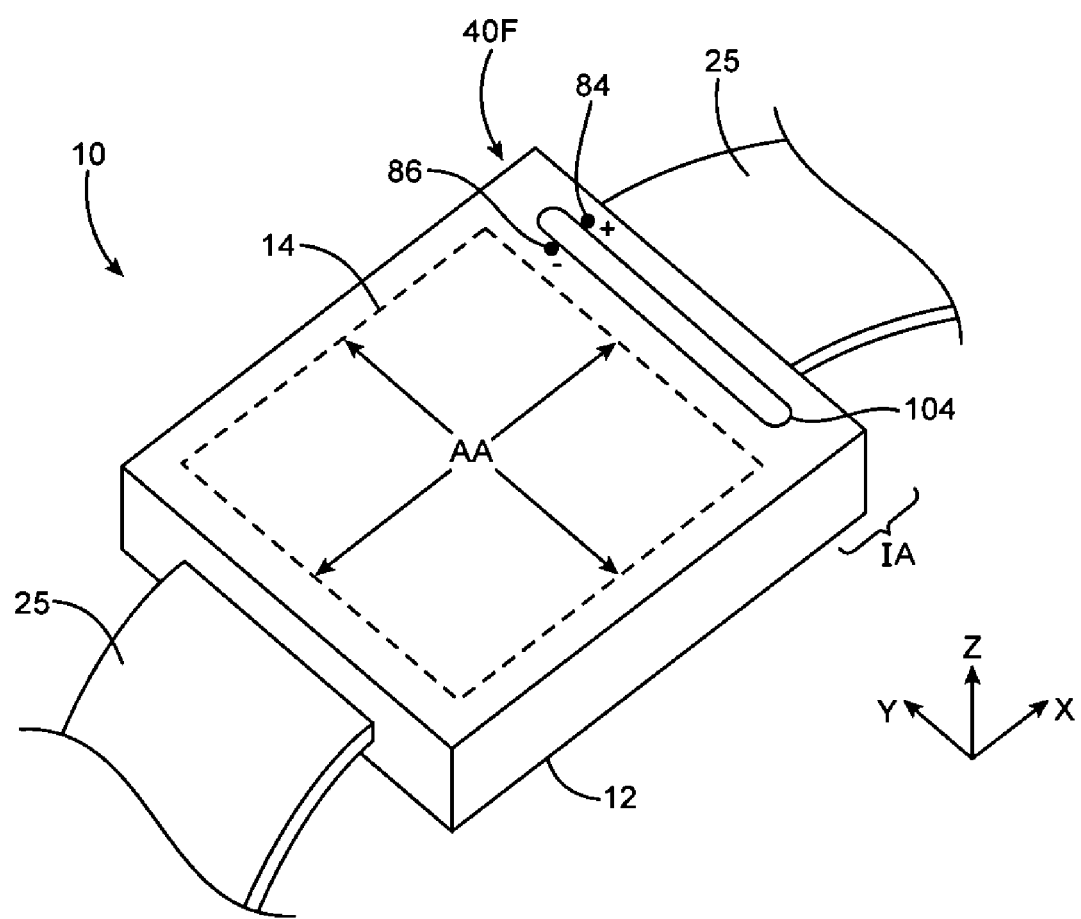
FIG. 12 is a perspective view of an illustrative wrist-watch device with a slot antenna in accordance with an embodiment.

FIG. 12 shows how antenna 40F may be a slot antenna. In the example of FIG. 12, display 14 has an active area AA. Peripheral border areas in display 14 may be inactive (i.e., free of light-emitting display pixels and, if desired, free of touch sensor structures). As shown in FIG. 12, antenna 40F may be formed from a slot in inactive area IA such as slot 104. Slot 104 may be fed by an antenna feed formed from antenna feed terminals 84 and 86 on opposing sides of slot 104. Slot 104 may extend entirely through device 10 and housing 12 in dimension Z.

If desired, near-field communications antenna 40N may operate through an electronic component such as display 14. This type of arrangement may be used in device 10 of FIG. 11, device 10 of FIG. 12, and/or other configurations for device 10.

Figure 13:
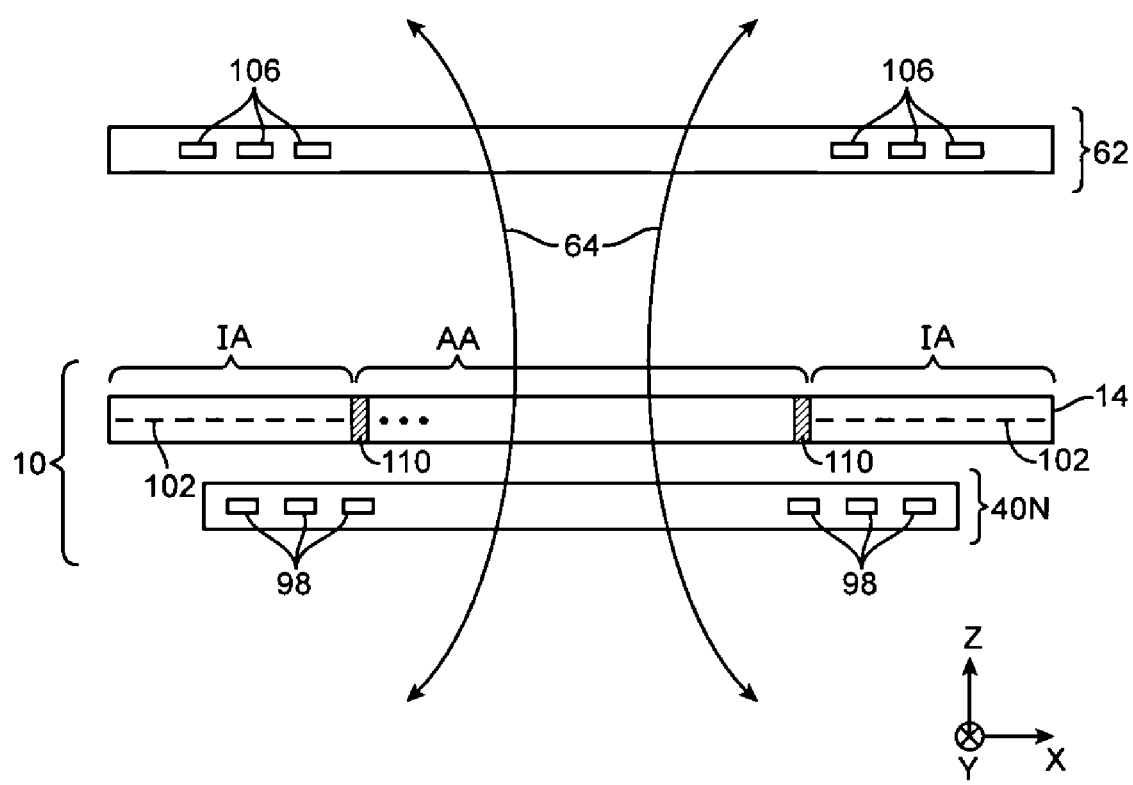
FIG. 13 is a cross-sectional side view of an illustrative electronic device with a near-field communications loop antenna wirelessly communicating with an external near-field communications loop antenna using electromagnetic near-field communication signals passing through a display that overlaps the near-field communications loop antenna in accordance with an embodiment.

As shown in FIG. 13, display 14 may overlap near-field communications antenna 40N. Display 14 may include an array of light-emitting display pixels 110 such as light-emitting diode display pixels or other types of display pixel structure. Display 14 may also include conductive structures 102 (e.g., thin-film transistors, touch sensor electrodes, metal signal line traces, etc.). In configurations in which the conductive structures of display 14 are relatively sparse and/or display 14 is not otherwise sufficiently conductive to completely shield near-field communications antenna 40N, at least some electromagnetic near-field communications signals 64 can pass through display 14 while being conveyed between coils 98 in near-field communications loop antenna 40N of electronic device 10 and electromagnetically coupled coils 106 in near-field communications loop antenna 62 of external equipment 58. Configurations of the type shown in FIG. 13 in which electromagnetic near-field communications signals pass through display 14 during near-field communications may allow a near-field communications antenna to be mounted in a device housing where space is limited.

Figure 14:
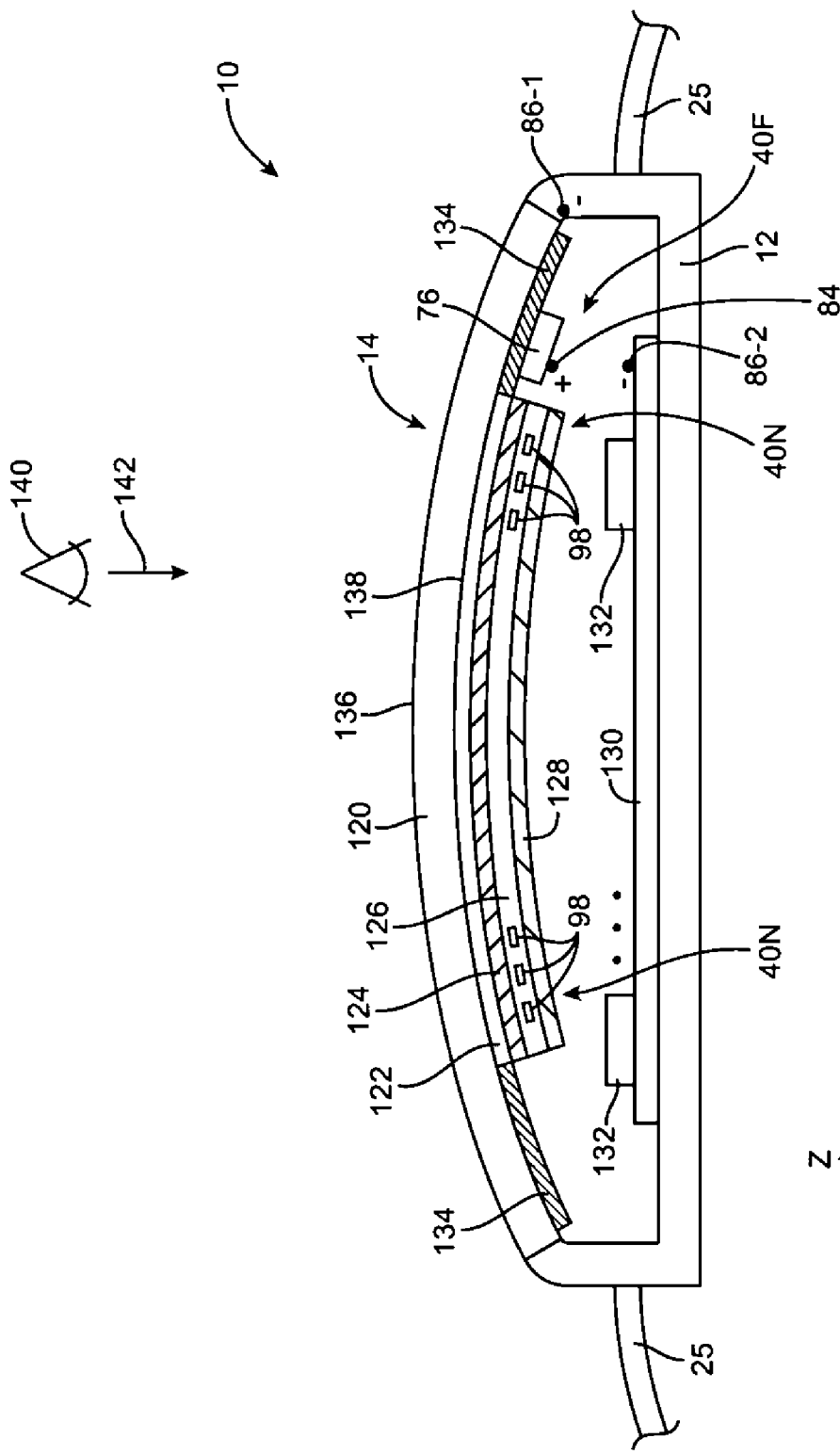
FIG. 14 is a cross-sectional side view of an illustrative electronic device such as a wrist-watch device having a near-field communications antenna operating through a display mounted on the curved underside of a display cover layer and having a non-near-field communications antenna mounted under the display cover layer adjacent to the display in accordance with an embodiment.

FIG. 14 is a cross-sectional side view of electronic device 10 of FIG. 5A or FIG. 5B in an illustrative configuration in which device 10 has a curved cover layer such as cover layer 120 with a curved (convex) outer surface 136 and an opposing curved (concave) inner surface 138. Display cover layer 120 may be formed from glass, plastic, fused silica, sapphire, or other transparent material.

Display pixel layer 124 may contain an array of display pixels for displaying images to a user such as viewer 140 who is observing display 14 in direction 142. The display pixels of layer 124 may be based on organic-light emitting diodes or other display pixel structures. Touch sensor 122 (e.g., a touch sensor based on a two-dimensional pattern of transparent capacitive touch sensor electrodes) may be interposed between display layer 124 and inner surface 138 of display cover layer 120. Substrate 126 may be a flexible printed circuit substrate or other dielectric substrate. Near-field communications loop antenna 40N may be formed from coils of metal signal lines 98 in substrate 126. Components 132 such as integrated circuits and other electrical components may be mounted on one or more printed circuits such as printed circuit 130 in the interior of housing 12. To prevent electromagnetic near-field communications signals from antenna 40N from creating eddy currents in metal portions of components 132 that could interfere with the operation of antenna 40N, ferromagnetic shielding layer 128 may be mounted under near-field communications antenna 40N (i.e., layer 128 may be formed under substrate 126 and coils 98 of near-field communications loop antenna 40N). Layers such as layers 122, 124, 126, and 128 may be attached to display cover layer 120 and/or each other using adhesive. The structures of layers 122, 124, 126, and 128 may be formed on separate substrates or may be deposited and patterned on shared support structures.

Opaque masking material such as black ink 134 may be formed on peripheral portions of inner surface 138 of display cover layer 120 to shield internal components in device 10 such as antenna structures from view from viewer 140. Opaque masking material 134 may be white, black, gray, red, blue, green, silver, gold, or other suitable colors.

During operation, near-field communications antenna 40N transmits and/or receives near-field communications electromagnetic signals in dimension Z through display layers in display 14 such as touch sensor 122 and display layer 124.

Non-near-field communications antenna 40F may be formed from a flexible printed circuit or other dielectric substrate with patterned metal traces that form resonating element 76. The antenna feed for non-near-field communications antenna 40F may include a positive antenna feed terminal such as positive antenna feed terminal 84 on resonating element 76. The antenna feed may also include a ground antenna feed terminal on housing 12 (see, e.g., terminal 86-1), a ground antenna feed on a printed circuit in device 10 such as printed circuit 130 (see, e.g., terminal 86-2), or other suitable antenna ground terminal.

Figure 15:
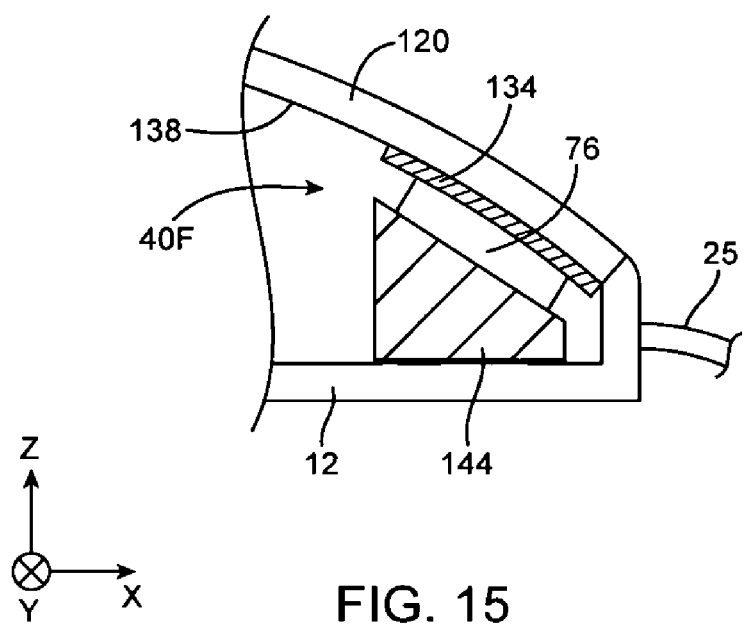
FIG. 15 is a cross-sectional side view of a portion of an electronic device such as a wrist-watch device having an antenna mounted under a display cover layer using a plastic carrier in accordance with an embodiment.

As shown in the cross-sectional side view of an illustrative portion of device 10 in FIG. 15, a plastic carrier or other support structure such as support structure 144 may be used to support antenna resonating element 76. Support structure 144 may be formed from a compressible material such as foam or may include a foam structure or other biasing structure to help press antenna resonating element 76 against inner surface 138 of display cover layer 120 (i.e., against opaque masking material 134). Antenna traces for antenna resonating element 76 may be formed directly on masking material 134, may be formed on a printed circuit such as a flexible printed circuit that is pressed upwards in dimension Z against masking material 134, may be formed as patterned metal traces on carrier 144, or may otherwise be incorporated into device 10.

Figure 16:
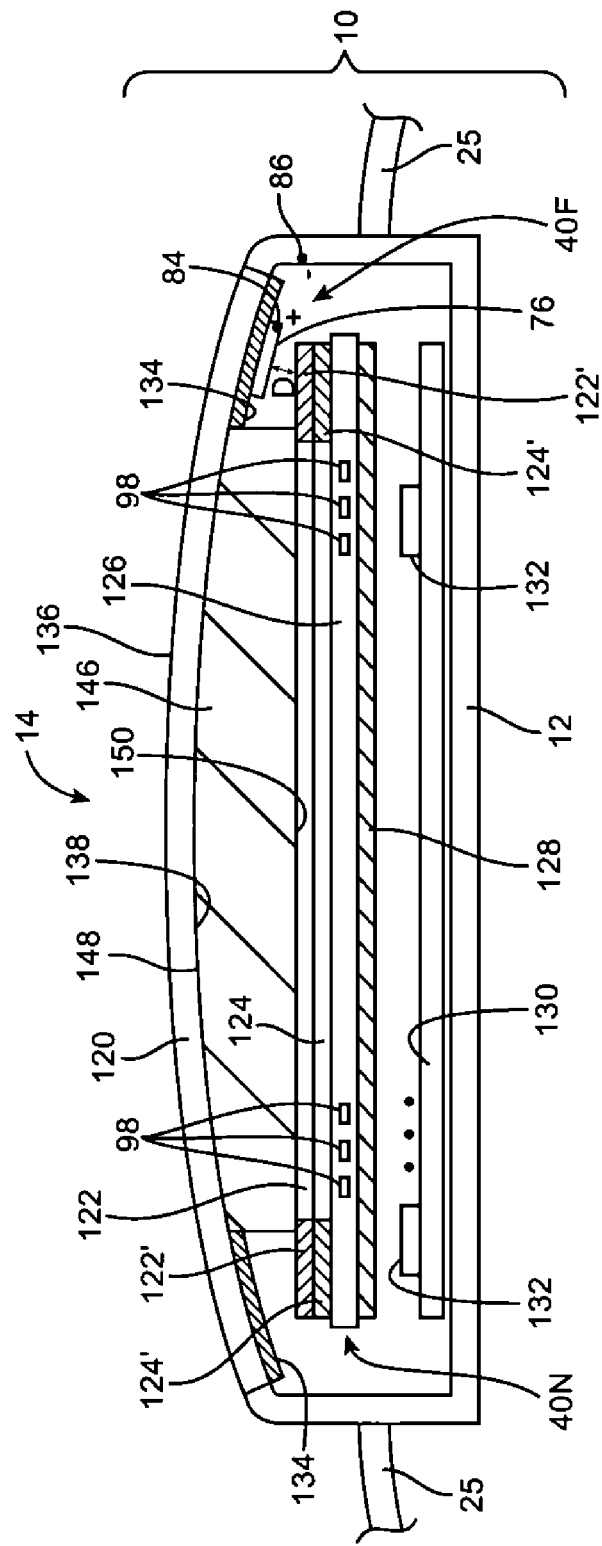
FIG. 16 is a cross-sectional side view of a portion of an electronic device such as a wrist-watch device having a near-field communications antenna operating through a display mounted on the underside of a clear inner display layer with a convex surface that is located under a curved display cover layer and having a non-near-field communications antenna mounted under the display cover layer adjacent to the display in accordance with an embodiment.

FIG. 16 is a cross-sectional side view of an illustrative configuration for device 10 showing how device 10 and display 14 may include internal transparent structures such as transparent display member 146 between display cover layer 120 and display pixel layer 124. Member 146 may be formed from a clear layer of dielectric and may have planar or curved surfaces.

As shown in FIG. 16, display cover layer 120 may have a curved (convex) outer surface such as outer surface 136 and an opposing curved (concave) inner surface such as inner surface 138. Transparent member 146 may have a curved (convex) outer surface such as surface 148 that matches the shape of inner surface 138. Transparent display member 146 may also have an opposing planer inner surface such as planar surface 150. A layer of adhesive interposed between surfaces 138 and 148 may, if desired, be used to attach member 146 to display cover layer 120. Display cover layer 120 and member 146 may be formed from clear glass, plastic, fused silica, sapphire, or other transparent material. Light reflections in display 14 may be minimized by forming layer 120 and member 146 from the same material or from different materials that share the same index of refraction.

Touch sensor 122 may, if desired, be interposed between display pixel layer 124 and planar surface 150 of member 146. Near field communications antenna 40N may be formed from looped conductive lines 98 on flexible printed circuit substrate 126. Flexible printed circuit 126 may be mounted under display pixel layer 124. Ferromagnetic shielding layer 128 may be mounted under display pixel layer 124 and under substrate 126 of antenna 40N. Because lower surface 150 is planar in the configuration of FIG. 16, touch sensor layer 122, display pixel layer 124, near-field antenna flexible printed circuit 126, and ferromagnetic layer 128 are planar in the configuration of FIG. 16.

The centermost portions of touch sensor layer 122 and display pixel layer 124 form an active area in display 14. Inactive border region 122' of touch sensor layer 122 may contain touch sensor drive circuits but are devoid of touch sensor capacitor electrodes. Inactive border region 124' of display pixel layer 124 may contain display driver circuitry but is devoid of light-emitting display pixels. Opaque masking material such as black ink 134 may be formed in peripheral portions of curved inner surface 138 of display cover layer 120 to hide border region 122' of touch sensor 122 from view and to hide border region 124' of display pixel layer 124 from view.

Antenna resonating element 76 for non-near-field antenna 40F may be mounted on inner surface 138 of display cover layer 120. Non-near-field antenna 40F may be fed using positive antenna feed terminal 84 on antenna resonating element 76 and ground antenna feed terminal 86. Ground antenna feed terminal 86 may be shorted to housing 12, metal traces on printed circuit 130, and/or metal traces on other layers in display 14 (e.g., touch sensor traces in touch sensor portion 122', display pixel layer portions such as portion 124', etc.). A dielectric-filled gap of dimension D may separate antenna resonating element 76 from nearby ground structures such as touch sensor portion 122', display pixel layer portion 124', metal housing 12, etc. The dielectric-filled gap may be occupied by a dielectric such as air, plastic, glass, sapphire, fused silica, or other dielectric.

Figure 17:
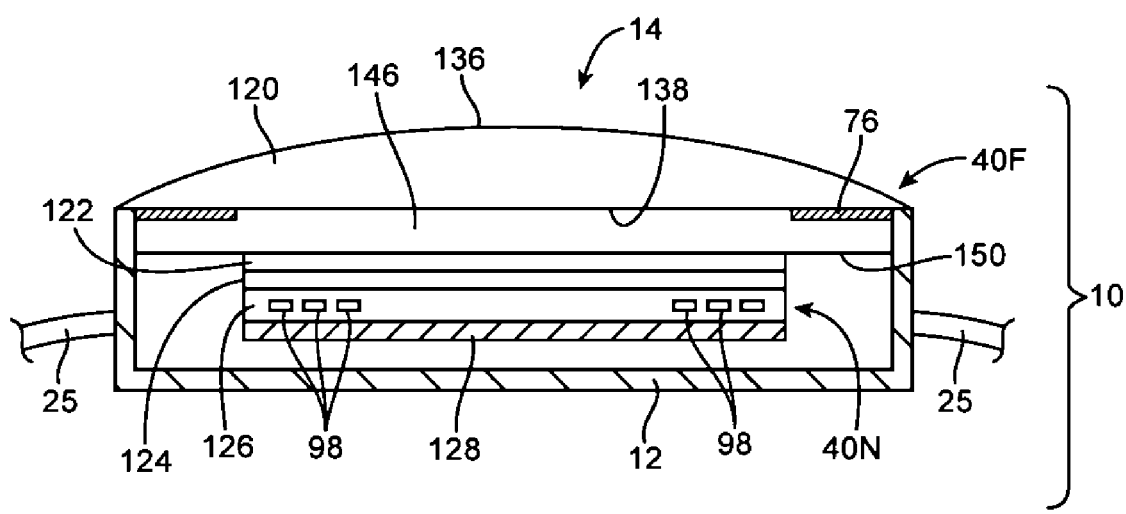
FIG. 17 is a cross-sectional side view of a portion of an electronic device such as a wrist-watch device having a near-field communications antenna operating through a display mounted on the underside of a planar clear display layer that is located under a display cover layer with a convex surface and having a non-near-field communications antenna mounted between the planar display layer and the display cover layer in accordance with an embodiment.

In the illustrative configuration of FIG. 17, display cover layer 120 has a curved (convex) outer (upper) surface 136 and an opposing planar inner (lower) surface 138. Clear display member 146 has a mating planar outer (upper) surface (i.e., a surface that has the same curvature as inner surface 138 of display cover structure 120). Clear display member 146 also has planar inner (lower) surface 150. Planar display layers such as touch sensor 122, display pixel layer 124, near-field communications antenna flexible printed circuit 126 for near-field communications antenna 40N, and ferromagnetic shield layer 128 may be mounted on planar inner surface 150. Antenna structures for antenna 40F such as antenna resonating element 76 may be interposed between the outer surface of clear display member 146 and inner surface 138 of display cover structure 120. A layer of black ink or other opaque masking material on surface 138 may, if desired, be used to hide antenna resonating element 76 and other internal structures in device 10 from view by a user.

The foregoing is merely illustrative and various modifications can be made by those skilled in the art without departing from the scope and spirit of the described embodiments. The foregoing embodiments may be implemented individually or in any combination.

What is claimed is:

1. An electronic device comprising:
 a housing;
 a curved cover layer for a display coupled to the housing;
 a display pixel layer for the display that is overlapped by the curved cover layer at an active area of the display;
 an antenna resonating element for an antenna that is overlapped by the curved cover layer at an inactive area of the display; and
 a biasing structure configured to press the antenna resonating element toward the curved cover layer at the inactive area of the display, wherein the antenna resonating element is disposed on a dielectric substrate and the biasing structure is configured to press the antenna resonating element toward the curved cover layer at the inactive area of the display by applying a force to the dielectric substrate in a direction toward the curved cover layer.

2. The electronic device defined in claim 1, wherein the antenna resonating element comprises conductive traces on the dielectric substrate.

3. The electronic device defined in claim 2, wherein the dielectric substrate is a flexible printed circuit substrate.

4. The electronic device defined in claim 1, wherein the antenna comprises a first antenna feed terminal on the antenna resonating element and a second antenna feed terminal coupled to an antenna ground for the antenna.

5. The electronic device defined in claim 4, wherein the antenna resonating element comprises an antenna resonating element arm, and the antenna comprises a return path that couples the antenna resonating element arm to the antenna ground.

6. The electronic device defined in claim 5, wherein the dielectric substrate comprises a flexible printed circuit substrate, and the antenna resonating element arm, the return path, and ground conductive traces are formed on the flexible printed circuit substrate.

7. The electronic device defined in claim 6, wherein the antenna ground comprises a portion of the housing and the ground conductive traces.

8. The electronic device defined in claim 1, wherein the curved cover layer has a curved outer surface and an inner surface opposite the curved outer surface, and the biasing structure is configured to press the antenna resonating element against the inner surface of the curved cover layer.

9. The electronic device defined in claim 8, wherein the inner surface is a curved inner surface.

10. The electronic device defined in claim 8 further comprising:
opaque material between the curved outer surface and the antenna resonating element.

11. The electronic device defined in claim 1, wherein the biasing structure comprises compressible material.

12. The electronic device defined in claim 1, wherein the biasing structure comprises a compressible foam structure.

13. The electronic device defined in claim 1 further comprising:
a strap attached to the housing.

14. The electronic device defined in claim 1, wherein the biasing structure is mounted to the housing.

15. An electronic device comprising:
a curved display cover layer;
a display pixel layer that overlaps the curved display cover layer;
a flexible printed circuit that includes a substrate and conductive traces on the substrate, the conductive traces forming an antenna resonating element configured to convey radio-frequency signals through the curved display cover layer; and
a biasing structure configured to apply a force toward the curved display cover layer that presses the flexible printed circuit toward the curved display cover layer.

16. The electronic device defined in claim 15 further comprising:
a housing, wherein the biasing structure is mounted between the housing and the flexible printed circuit.

17. The electronic device defined in claim 15, wherein the biasing structure comprises foam.

18. The electronic device defined in claim 15, wherein the conductive traces form an antenna ground and a return path that is coupled between the antenna resonating element and the antenna ground.

19. An electronic device comprising:
a housing;
a curved cover layer for a display coupled to the housing;
a display pixel layer for the display that is overlapped by the curved cover layer at an active area of the display;
an antenna resonating element for an antenna that is overlapped by the curved cover layer at an inactive area of the display; and
a biasing structure configured to apply a force toward the curved cover layer that presses the antenna resonating element toward the curved cover layer at the inactive area of the display.

20. The electronic device defined in claim 19, wherein the antenna resonating element is pressed against an inner surface of the curved cover layer.

* * * * *